United States Patent
Chung et al.

(10) Patent No.: US 7,049,203 B2
(45) Date of Patent: May 23, 2006

(54) SEMICONDUCTOR DEVICE HAVING A CAPACITOR AND METHOD OF FABRICATING SAME

(75) Inventors: Tae-Young Chung, Kyungki-do (KR); Jae-Goo Lee, Seoul (KR); Je-Min Park, Kyungki-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 88 days.

(21) Appl. No.: 10/427,171

(22) Filed: Apr. 30, 2003

(65) Prior Publication Data

US 2004/0217406 A1 Nov. 4, 2004

(51) Int. Cl.
*H01L 21/20* (2006.01)
(52) U.S. Cl. .............. 438/396; 438/243; 438/253; 438/386; 257/303; 257/304; 257/311
(58) Field of Classification Search ........ 438/397–399, 438/254–256, 239, 381, 396, 253
See application file for complete search history.

(56) References Cited

U.S. PATENT DOCUMENTS

| | | | |
|---|---|---|---|
| 6,459,112 B1 | 10/2002 | Tsuboi et al. | |
| 6,461,911 B1 | 10/2002 | Ahn et al. | |
| 6,482,696 B1 | 11/2002 | Park | |
| 6,673,670 B1 * | 1/2004 | Roberts et al. | 438/253 |
| 6,709,915 B1 * | 3/2004 | Lee | 438/239 |
| 6,790,725 B1 * | 9/2004 | Coursey | 438/253 |
| 2003/0001268 A1 | 1/2003 | Oh | |
| 2003/0122174 A1 * | 7/2003 | Fukuzumi | 257/306 |

FOREIGN PATENT DOCUMENTS

| | | |
|---|---|---|
| GB | 2 386 471 A | 9/2003 |
| KR | 2004-2221 | 1/2004 |

OTHER PUBLICATIONS

English language abstract of Korean Publication No. 2004-2221.

* cited by examiner

*Primary Examiner*—Kenneth Parker
*Assistant Examiner*—José R. Díaz
(74) *Attorney, Agent, or Firm*—Marger Johnson & McCollom, P.C.

(57) ABSTRACT

A semiconductor device comprises a semiconductor substrate and an interlayer insulating layer formed on the semiconductor substrate. The interlayer insulating layer preferably has a contact pad formed therein. A capacitor lower electrode is electrically connected to the contact pad. The capacitor lower electrode further comprises a pad-shaped storage node electrically connected to the contact pad; and a cup-shaped storage node arranged on the pad-shaped storage node. In this manner, it is possible to increase capacitance while reducing not open contacts. Leaning of the storage nodes can also be significantly reduced.

5 Claims, 12 Drawing Sheets

OCS LEANING

FIG.4
(PRIOR ART)

NOT OPEN

SEMICONDUCTOR DEVICE HAVING A CAPACITOR AND METHOD OF FABRICATING SAME

BACKGROUND OF THE INVENTION

1. Field of the Invention

The present invention relates generally to semiconductor devices and, more particularly, to a capacitor structure and a method for forming the same.

2. Description of the Related Art

Many state-of-the-art integrated circuits require the use of capacitors. For example, in dynamic random access memory (DRAM) devices, capacitors perform a vital data storing function. As DRAM and other memory devices become more highly integrated, new fabrication techniques are required to increase the storage capacity of these capacitors. It has become more difficult, however, to obtain the required capacitance levels. Adequate capacitance levels are important in obtaining proper device characteristics such as data retention, refresh effects, and constant operation characteristics.

Figure 1:
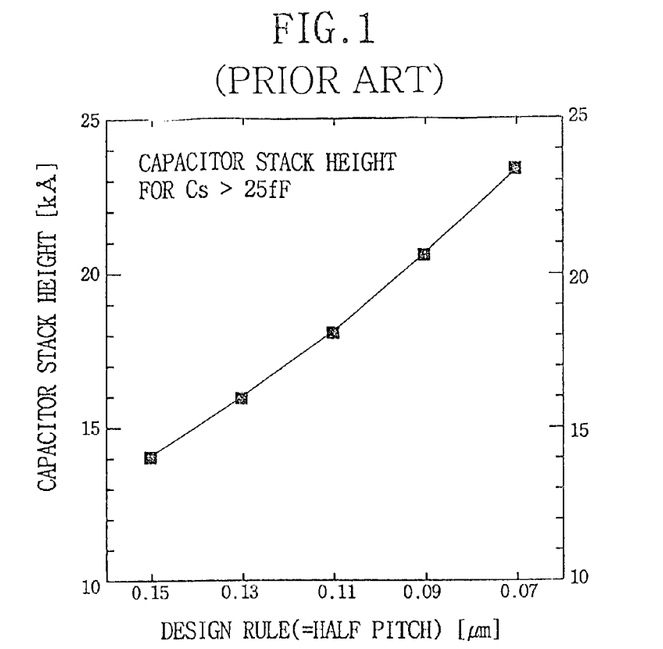
FIG. 1 is a graph illustrating the relationship between the height of the storage node and a design rule, according to the related art.

To increase capacitance levels, the semiconductor industry has focused on developing capacitor electrodes having three-dimensional structures. This is because the capacitance of a capacitor is directly proportional to the surface area of the capacitor electrodes. Accordingly, fabrication technologies have been developed to increase the effective surface area by increasing the height of the cell capacitor electrode or storage node. FIG. 1, for example, is a graph showing the relationship between the height of the storage node with respect to a design rule according to the related art. As shown in FIG. 1, in the related art, as the design rule decreases, the storage node height increases.

Figure 2:
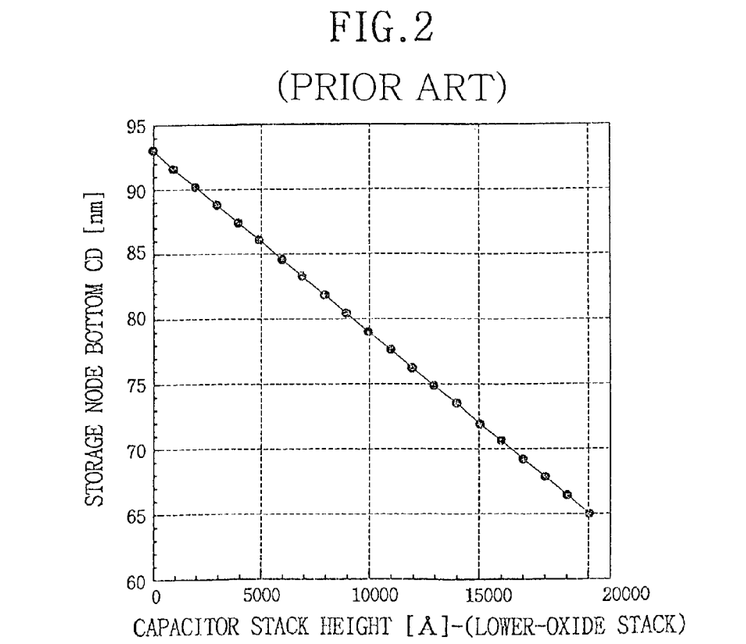
FIG. 2 is a graph illustrating the relationship between the bottom critical dimension (CD) of a storage node and the height of the storage node, according to the related art.
Figure 3:
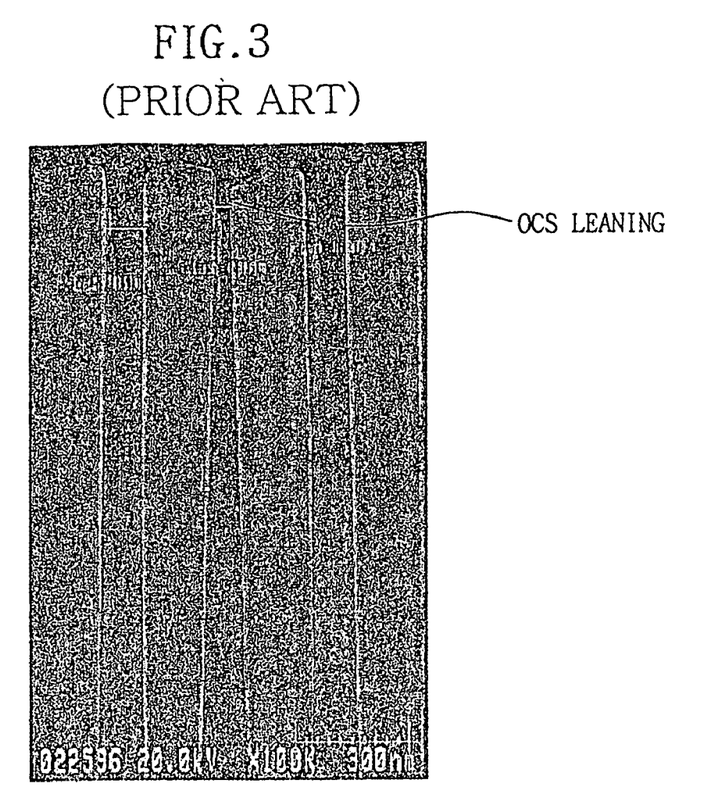
FIG. 3 is cross-sectional view of a semiconductor device showing leaning storage nodes of capacitor structures according to the related art.

Unfortunately, however, increasing the height of the storage node can result in several problems. For example, if the required height of the storage node is more than about 10,000 angstroms, it becomes very difficult to pattern conductive layers as storage nodes. Also, as the storage node height increases, the possibility of leaning storage nodes also increases significantly. Leaning storage nodes can result in an electrical bridge between adjacent storage nodes. This is partly illustrated in FIGS. 2 and 3. FIG. 2 is a graph schematically illustrating that as the height of the storage node increases, the CD (critical dimension) of the bottom storage node decreases. FIG. 3 is a photograph of conventional capacitor structures in a semiconductor device of the related art showing various storage nodes leaning toward adjacent storage nodes.

Figure 4:
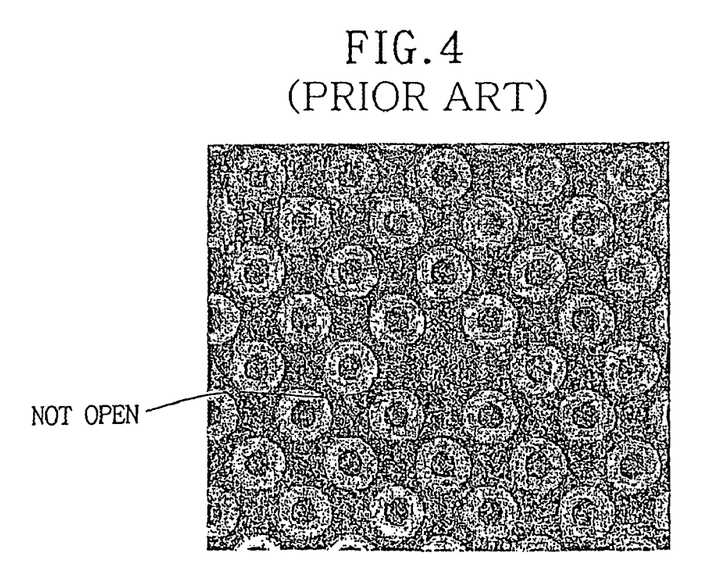
FIG. 4 is top view of capacitor structures of a semiconductor device illustrating a closed ("not open") storage node contact according to the related art.

In addition to the problems identified above, as the design rule is decreased, problems with closed storage node contacts increase. FIG. 4 is a photograph showing a closed storage node contact, showing a "not open" phenomenon, in a conventional capacitor array of a semiconductor memory device according to the related art. Because of these and other problems, there remains a significant need for improved integrated circuit capacitors and methods of forming the same.

SUMMARY OF THE INVENTION

According to one embodiment of the present invention, a semiconductor device preferably comprises a semiconductor substrate and an interlayer insulating layer formed on the semiconductor substrate. The interlayer insulating layer can include a storage node contact pad formed therein. A capacitor lower electrode is preferably electrically connected to the contact pad. The capacitor lower electrode can further comprise a pad-shaped storage node electrically connected to a storage node contact pad. A cup-shaped storage node is preferably arranged on the pad-shaped storage node. With this novel capacitor lower electrode structure, it is possible to increase capacitance and to reduce the occurrence of closed contacts. Leaning of storage nodes can also be significantly reduced.

The present invention also contemplates other methods of increasing the surface area of the capacitor electrodes without increasing the height of the electrode. For instance, other methods could also be used to increase the surface area of the pad-shaped storage node and still fall within the spirit and scope of the inventive principles herein. Increasing the width of the pad-shaped storage node is but one way to achieve this goal. Altering the shape of the pad-shaped storage node to increase the surface area thereof is another way to achieve increased capacitance without increasing the height of the electrode.

BRIEF DESCRIPTION OF THE DRAWINGS

The foregoing and other objects, features, and advantages of the invention will become more readily apparent from the following detailed description of a preferred embodiment proceeding with reference to the following drawings, in which:

In FIGS. 5–16, odd number figures represent bit-line direction cross-sectional views and even number figures represent word-line direction cross-sectional views.

DETAILED DESCRIPTION

A preferred embodiment of the present invention will now be described in detail with reference to FIGS. 5–16 to provide a more thorough understanding of the principles of the present invention. Those of ordinary skill in the art will recognize, however, that the invention may be practiced in various alternative forms. Furthermore, descriptions of well-known structures and techniques may be omitted herein to avoid unnecessarily obscuring the principles of the present invention.

Figure 15:
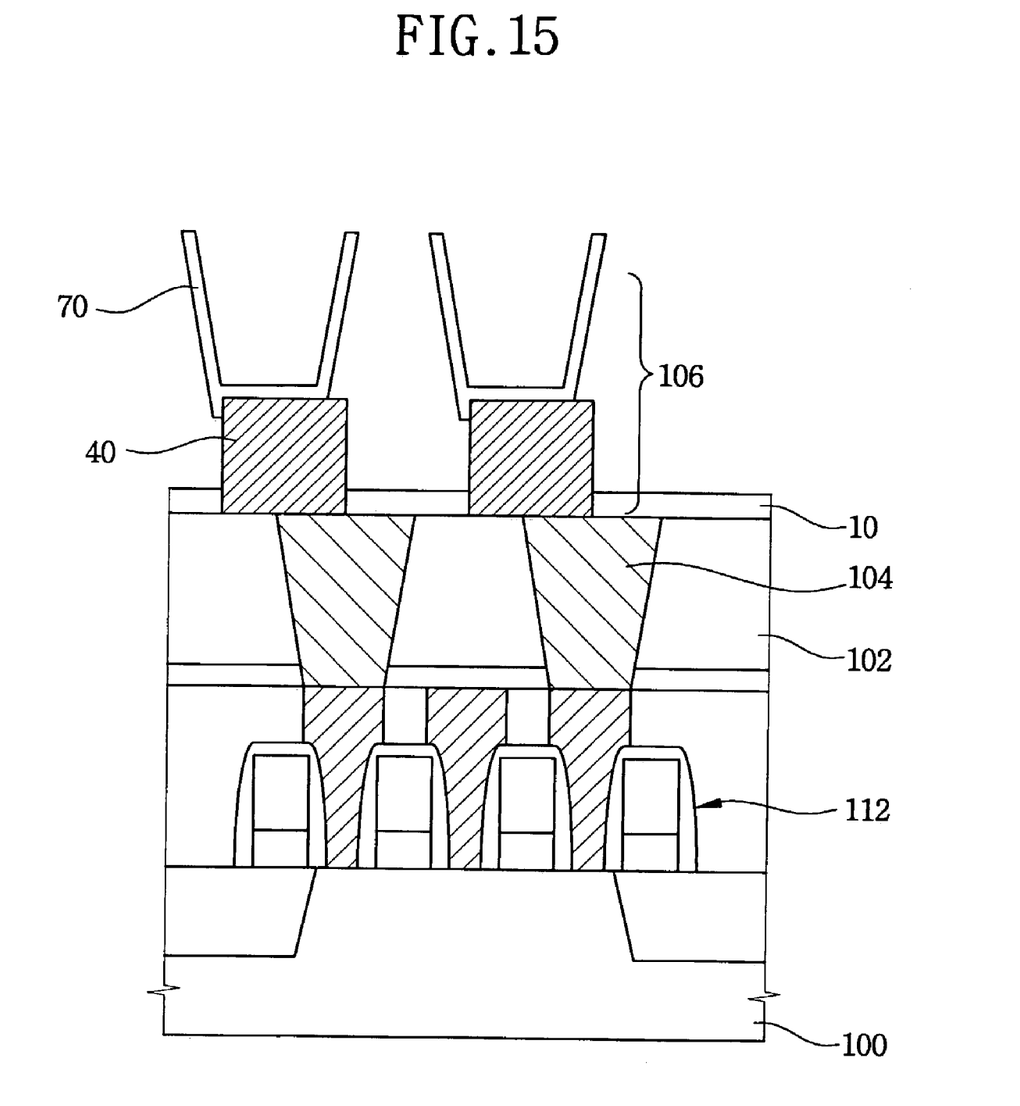

Referring first to FIG. 15, a semiconductor device according to a preferred embodiment of the present invention preferably comprises an interlayer insulating layer 102 formed on a semiconductor substrate 100. The interlayer insulating layer 102 preferably has a storage node contact pad 104 formed therein. A capacitor lower electrode 106 can be formed on and electrically connected to the contact pad

104. The capacitor lower electrode 106 comprises a pad-shaped storage node 40 arranged on and electrically connected to the storage node contact pad 104, and a cup-shaped storage node 70 arranged on the pad-shaped storage node 40.

The pad-shaped storage node 40 can comprise any shape suitable for supporting the cup-shaped storage node 70, such as, for example, a box-type storage node having four sides or a solid (not hollow) cylinder-shaped node. The cup-shaped node 70 can comprise a "one cylinder stack" (OCS) structure. Cup-shaped storage nodes 70 have a capacitance of about two times larger than simple stack capacitor structures because both outer and inner surfaces of the cup-shaped nodes can be utilized as effective capacitor areas.

Figure 17:
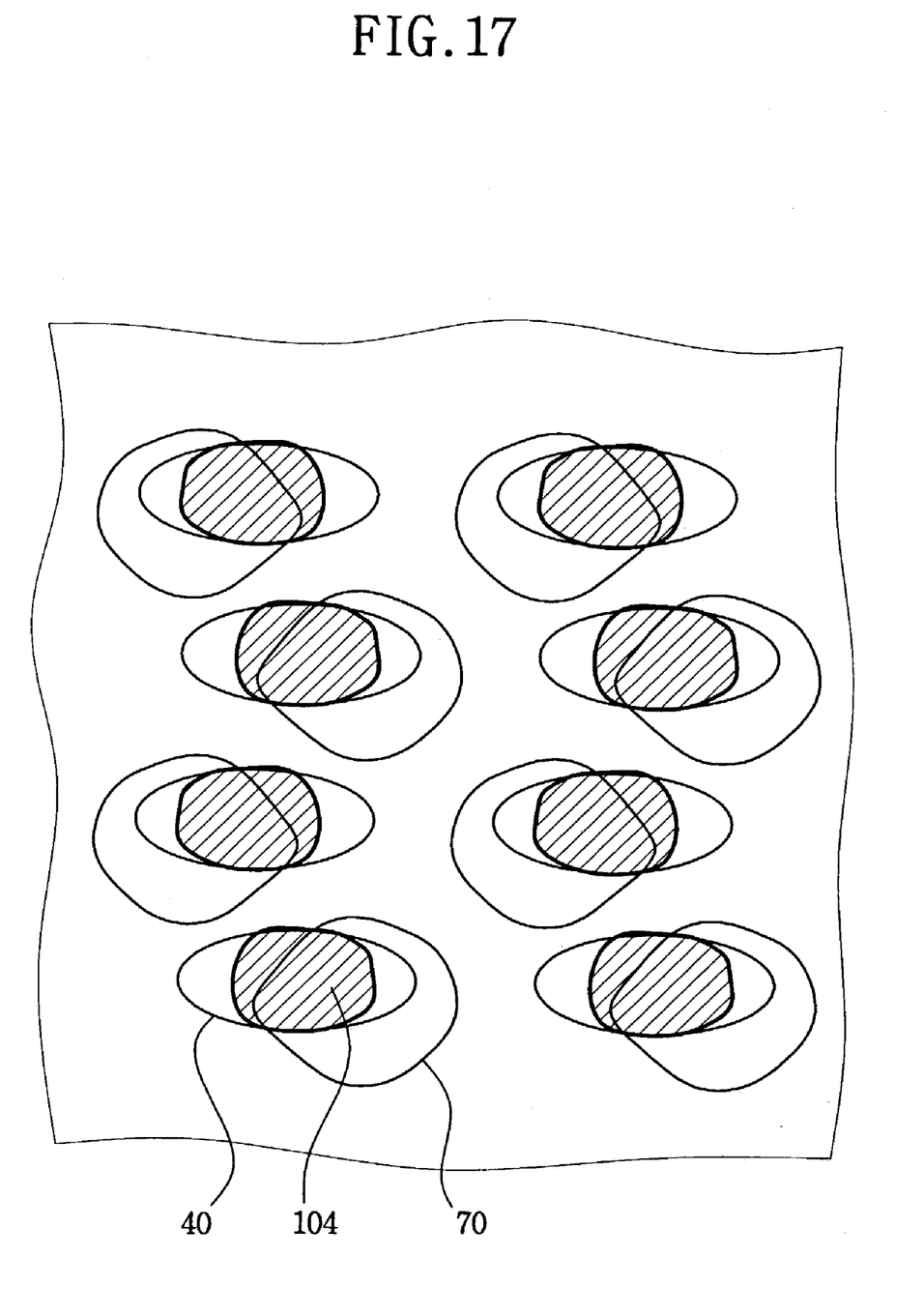
FIG. 17 is a plan view of a capacitor lower electrode according to an aspect of the present invention.

FIG. 17 is a plan view of the capacitor lower electrode 106 including the pad-shaped storage node 40, and the cup-shaped storage node 70 overlying the storage node contact pad 104, according to the preferred embodiment of the present invention shown in FIG. 15. Referring to FIG. 17, although the cup-shaped storage node 70 is shown to have a substantially square shape, it can be, for example, a circle, an oval, a diamond, or any other suitable shape in plan view.

Figure 5:
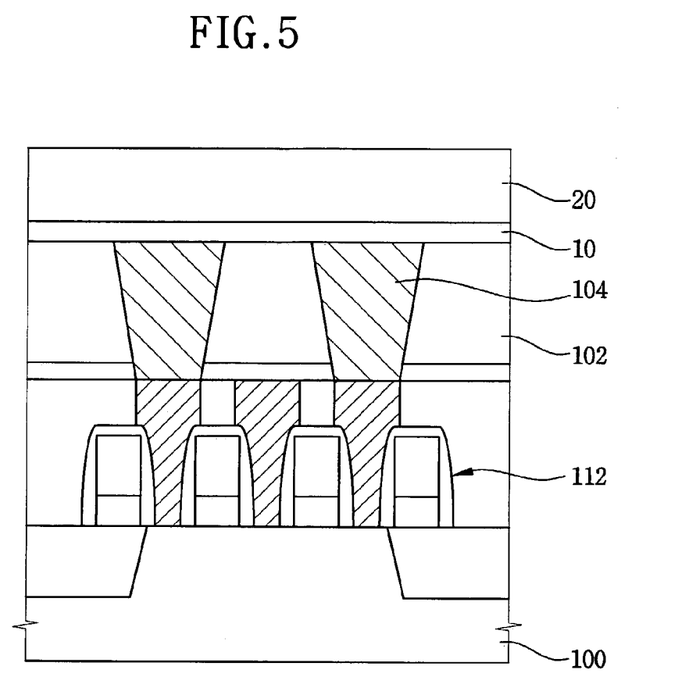
FIGS. 5–16 are schematic cross-sectional views of a semiconductor device illustrating a method for fabricating capacitor structures of an integrated circuit memory device according an embodiment of to the present invention.
Figure 6:
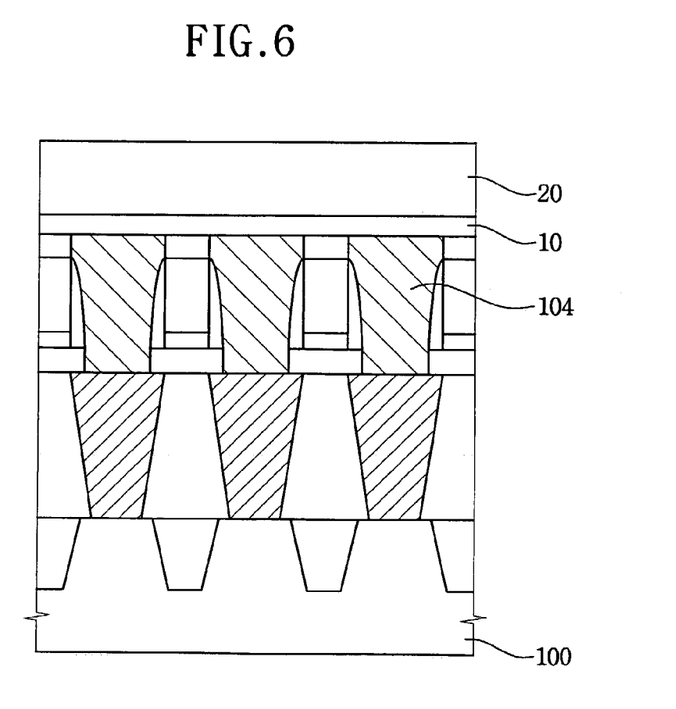

FIGS. 5–16 are cross-sectional views illustrating a method of fabricating the integrated circuit memory device of FIGS. 15 and 17 according to another aspect of the present invention. Referring to FIGS. 5 and 6, a lower structure, such as a gate stack 112 or a bit line (not shown), are preferably formed on a semiconductor substrate 100. An interlayer insulating layer 102 is subsequently formed of a dielectric material, such as oxide, on the resulting structure.

Next, a storage node contact pad 104 can be formed in the interlayer insulating layer 102 to be electrically connected to an active region of the semiconductor substrate 100. An etch stop layer 10 and a first sacrificial layer 20 are then preferably sequentially formed on the storage node contact pad 104 and on the interlayer insulating layer 102. These layers can be formed using conventional processes.

The etch stop layer 10 preferably has a high etch selectivity with respect to the first sacrificial layer 20. The etch stop layer 10 can be formed of silicon nitride, for example, to a thickness between about 500 to 1000 angstroms. The etch stop layer 10 preferably serves as an end point during a subsequent etching lift-off process for removing the first sacrificial layer 20, as well as second and third sacrificial layers to be formed thereon.

The first sacrificial layer 20 is preferably formed of an oxide having a thickness between about 3000 to 20000 angstroms using a conventional technique such as a low pressure chemical vapor deposition (LPCVD) process. The first sacrificial layer 20 can be a single layer of plasma-enhanced tetraethylorthosilicate (PE-TEOS) or a multilayer including the PE-TEOS layer.

Figure 7:
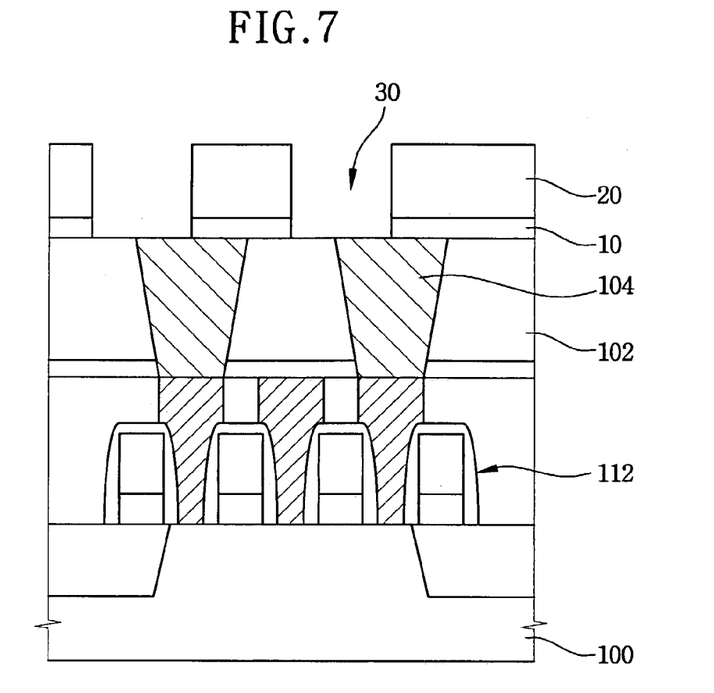
Figure 8:
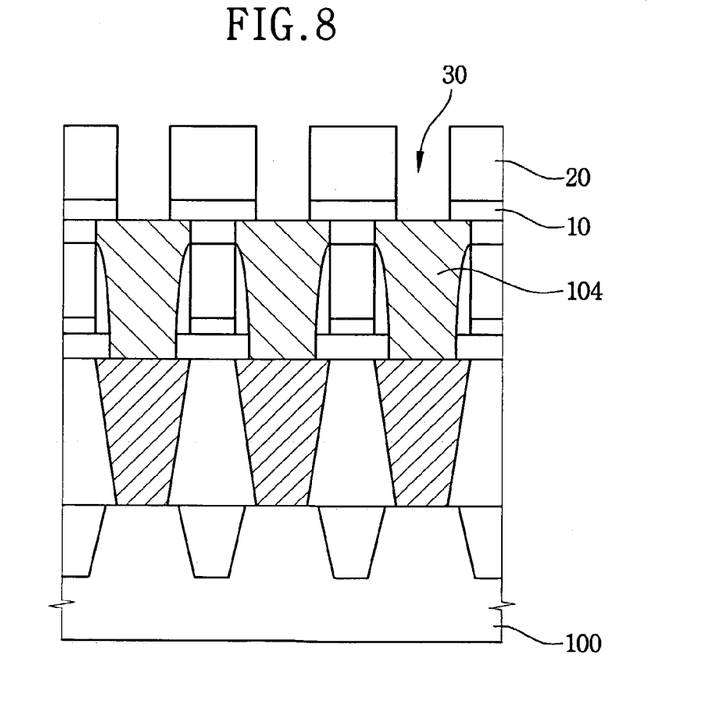

Referring now to FIGS. 7 and 8, a first storage node opening 30 is preferably formed within the first sacrificial layer 20 using conventional photolithography and etching processes, with the etch stop layer 10 acting as an etch stop. The etch stop layer 10 remaining within the first storage node opening 30 is preferably removed.

Figure 9:
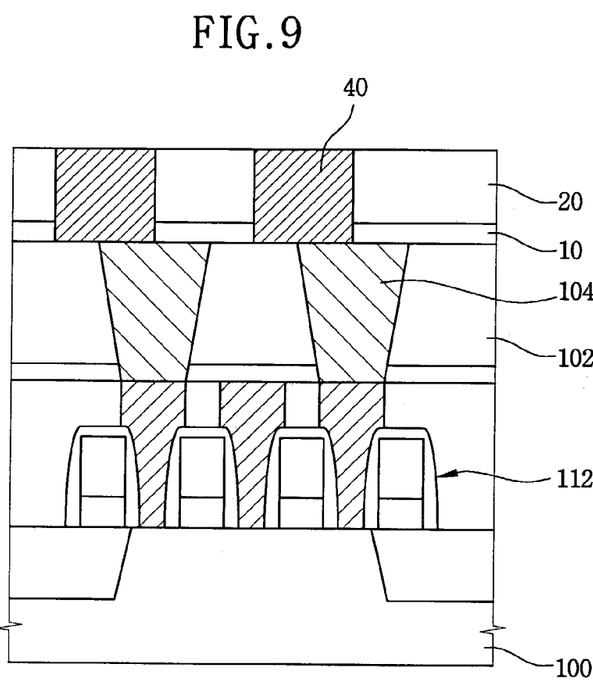
Figure 10:
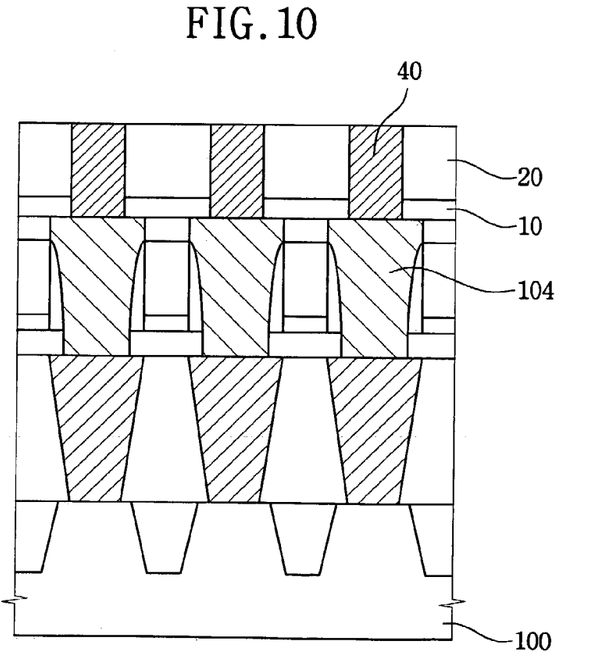

Referring to FIGS. 9 and 10, a pad-shaped (e.g., box-type) storage node 40 can be formed within the first storage node opening 30 using LPCVD and CMP processes. A conductive material such as doped polysilicon, Pt, Ru, or TiN, can be deposited over the resulting structure within the first storage node opening 30 and planarized to form the pad-shaped storage node 40.

Figure 11:
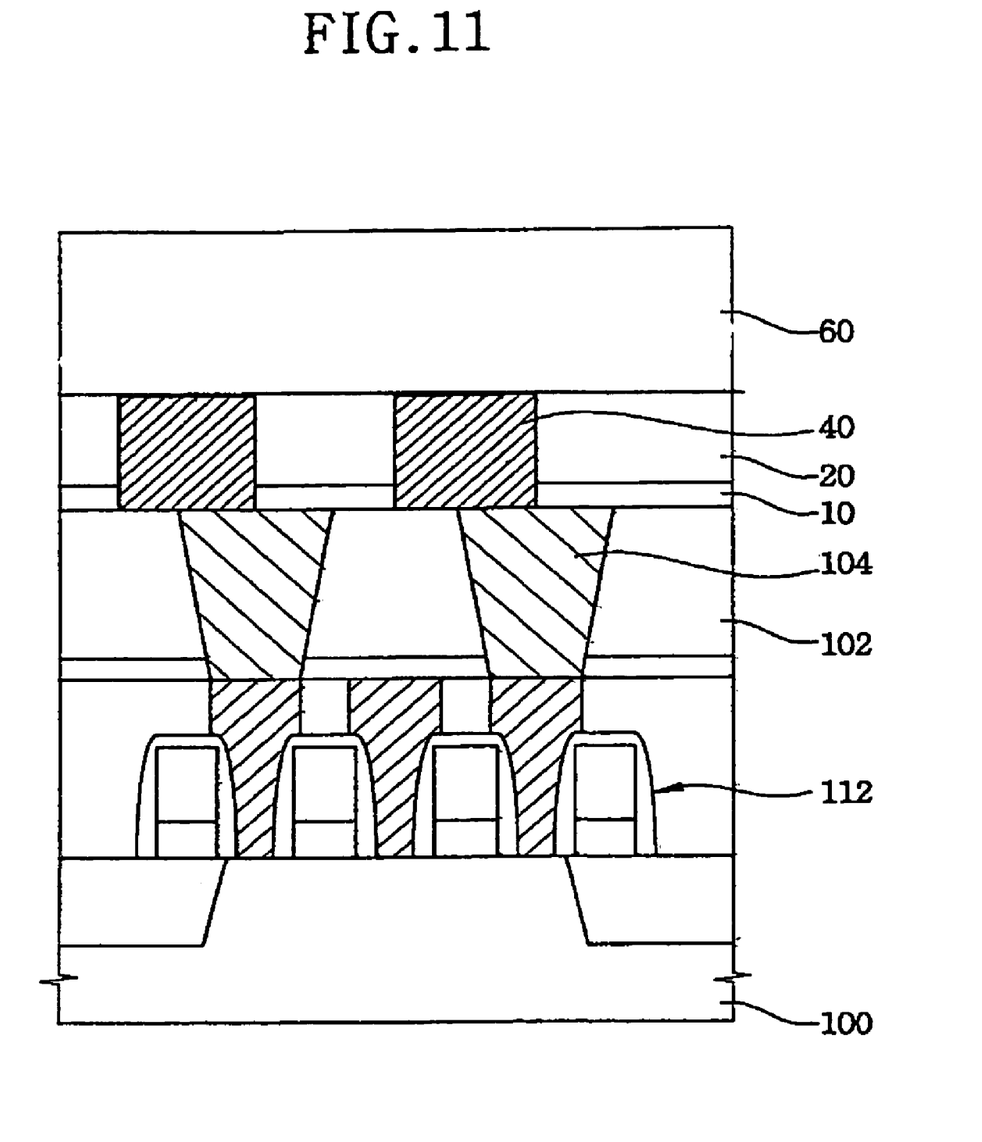
Figure 12:
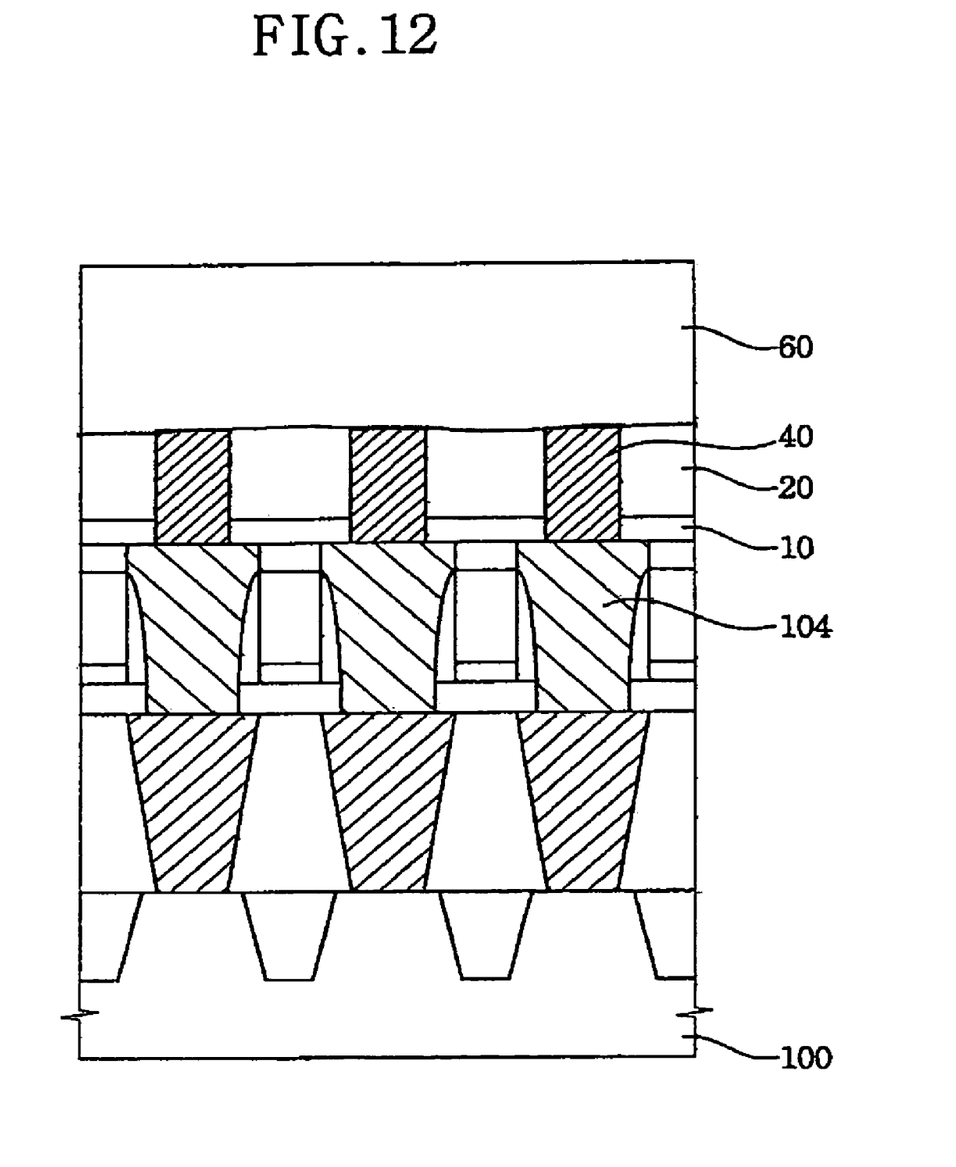

Referring to FIGS. 11 and 12, a second sacrificial layer 60 can then be formed on the first sacrificial layer 20 and on the pad-shaped storage node 40. The second sacrificial layer 60 is preferably formed of oxide to a thickness between about 10000 to 30000 angstroms. Those skilled in the art will appreciate that other suitable dielectric materials can also be used to form the first and second sacrificial layers 20, 60.

Figure 13:
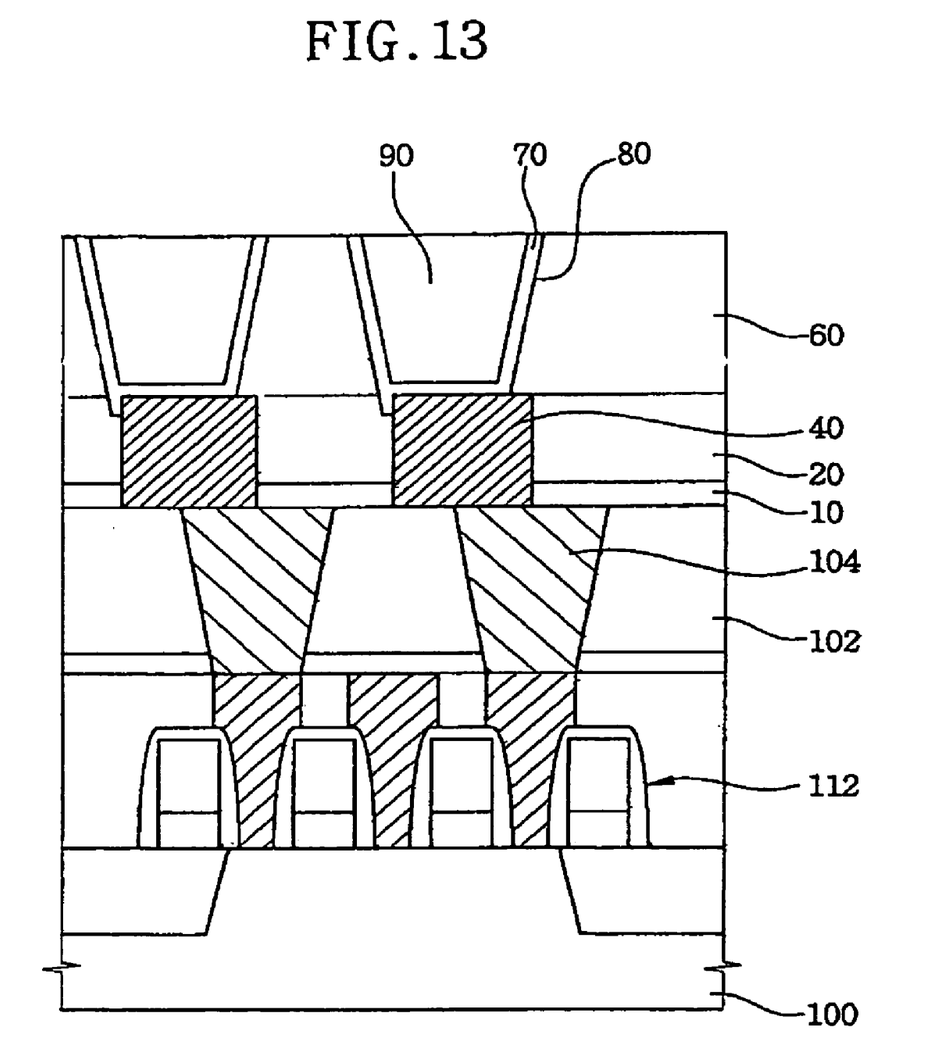
Figure 14:
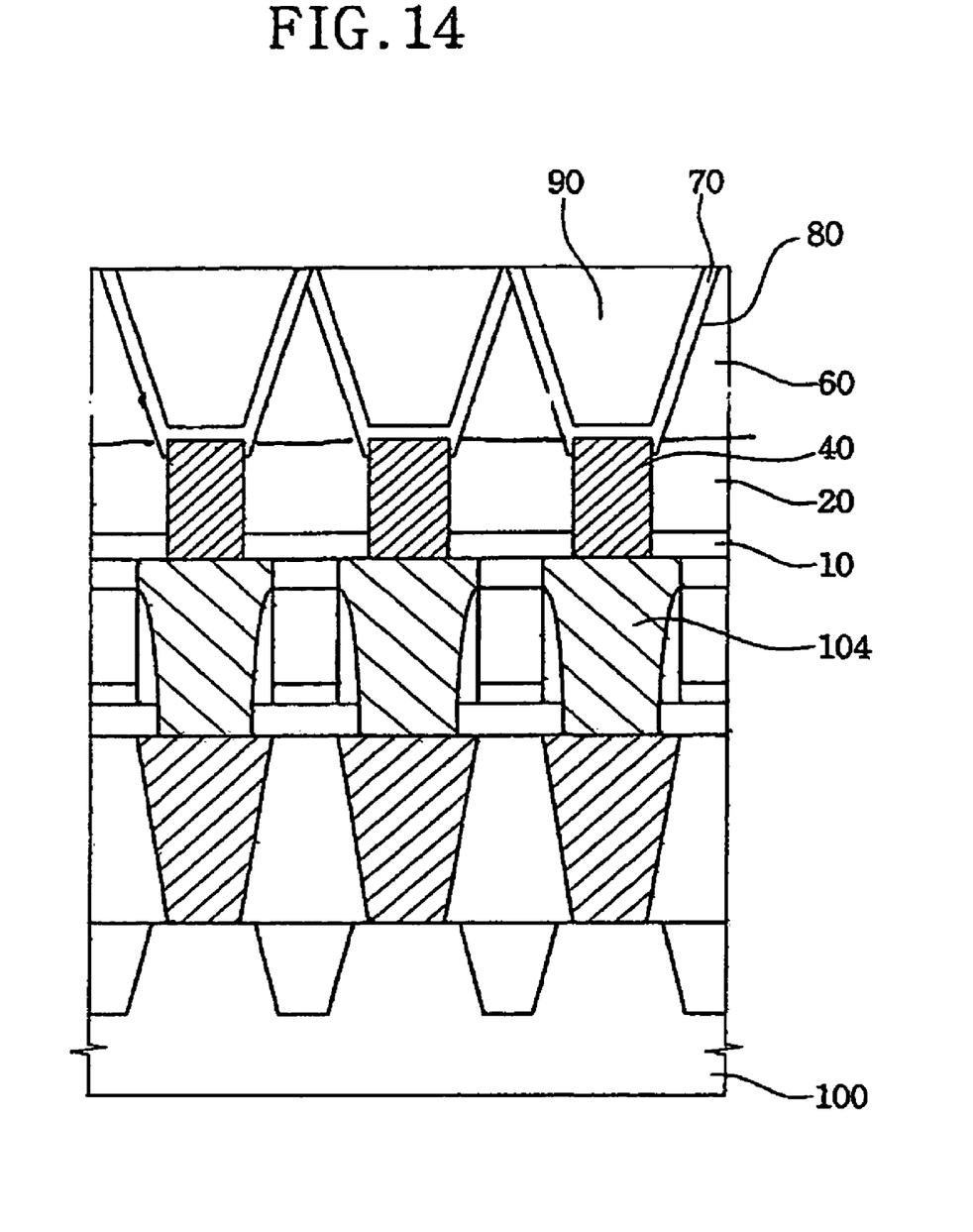

Referring now to FIGS. 13 and 14, a second storage node opening 80 is preferably formed in the first and second sacrificial layers 20, 60 using conventional photolithography and etching processes. A conductive material such as doped polysilicon can then be formed over the resulting structure within the second storage node opening 80 using a conventional process such as an LPCVD process to provide a cup-shaped storage node 70.

A third sacrificial layer 90 can be formed on the cup-shaped storage node 70, of a material such as oxide, using a conventional technique such as an LPCVD process. The third sacrificial layer 90 is preferably formed of a dielectric material such as an undoped silicate glass (USG) layer to a thickness between about 3000 to 5000 angstroms.

The resulting structure is then preferably planarized to form cup-shaped storage nodes 70, which are separated from adjacent cup-shaped storage nodes 70. Accordingly, each cup-shaped storage node 70 (e.g., an OCS type storage node) can be formed in the second storage node opening 80 overlying the pad-shaped storage node 40. A conventional planarization process such as a CMP process or an etch back process can be carried out to isolate each storage structure (capacitor lower electrode) 106.

Figure 16:
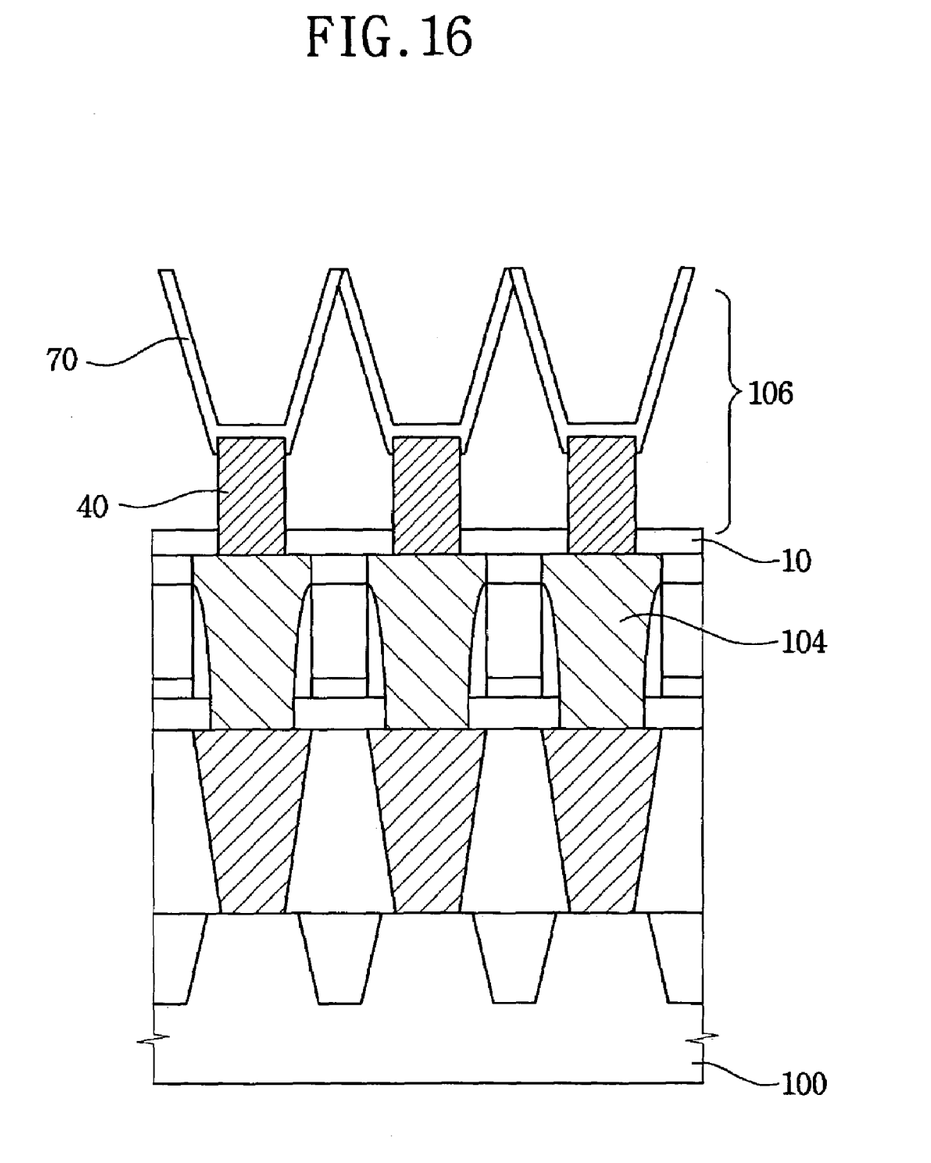

Referring to FIGS. 15 and 16, the first, second, and third sacrificial layers 20, 60, 90 are preferably concurrently removed using a conventional lift-off process to form a novel capacitor lower electrode 106, according to the preferred embodiment of the present invention. Thus, the capacitor lower electrode of the present invention preferably comprises two sequentially stacked sections. A first section is preferably comprised of a pad-shaped (e.g., box-type) storage node 40. A second section is preferably comprised of a cup-shaped (e.g., OCS square-type) storage node 70, stacked on top of the pad-shaped storage node 40. The height ratio between the pad-shaped storage node 40 and the cup-shaped storage node 70 is preferably about 0.9:1. The height of the cup-shaped storage node is thus preferably lower than that of the conventional OCS storage node. As a result, leaning of the storage node can be significantly reduced, while capacitance levels of the capacitors can be increased.

The principles of the present invention are therefore capable of providing a memory capacitor structure and method of forming it that provides a more reliable and robust storage node. The preferred embodiment of the present invention further provides a simple lift-off process because less of the sacrificial layer needs to be removed within the cup-shaped or OCS storage nodes, as compared to the related art. In addition, because a cup-shaped storage node opening can be formed having a sufficient photolithography margin, a not open contact phenomenon can be substantially reduced. Further, the width of a bottom portion of a capacitor lower electrode can be increased compared to the related art and leaning can be prevented, while increasing the capacitance of the capacitor structure using a cup-shaped storage node or an OCS storage node.

Having described and illustrated the principles of the invention according to a preferred embodiment thereof, it should be apparent that the invention can be modified in arrangement and detail without departing from such principles. We therefore claim all modifications and variation coming within the spirit and scope of the following claims.

What is claimed is:

1. A method for forming a semiconductor device, the method comprising:
   forming a first interlayer insulating layer on a semiconductor substrate, the first interlayer insulating layer having a contact plug therein between a pair of gate stacks;
   forming a second interlayer insulating layer on the first interlayer insulating layer, the second interlayer insulating layer having a contact pad therein, the contact pad electrically connected to the contact plug;
   forming an etch stop layer on the second interlayer insulating layer;
   forming a first sacrificial layer on the etch stop layer;
   forming a first storage node opening in the first sacrificial layer;
   forming a pad-shaped storage node in the first storage node opening;
   forming a second sacrificial layer overlying the resulting structure including the pad-shaped storage node;
   forming a second storage node opening in the second sacrificial layer overlying the pad-shaped storage node;
   forming a cup-shaped storage node in the second storage node opening, wherein the cup-shaped storage node comprises a single cylindrically shaped structure; and
   removing the first and the second sacrificial layers to form a capacitor lower electrode.

2. A method according to claim 1, wherein removing the first and the second sacrificial layers to form the capacitor lower electrode comprises using a planarization or etch back process to isolate the capacitor lower electrode from other capacitor lower electrodes.

3. A method according to claim 2, wherein the etch stop layer acts as an etch stop during forming the first storage node opening in the first sacrificial layer.

4. A method according to claim 1, wherein a central vertical axis of the cup-shaped storage node is offset from a central vertical axis of an adjacent cup-shaped storage node of an adjacent capacitor lower electrode of the semiconductor device.

5. A method according to claim 1, wherein the contact pad is located between a pair of bit lines.

* * * * *